US010678124B2

(12) United States Patent
Wei et al.

(10) Patent No.: US 10,678,124 B2
(45) Date of Patent: Jun. 9, 2020

(54) METHOD FOR MANUFACTURING COLOR FILTER SUBSTRATE

(71) Applicants: BOE TECHNOLOGY GROUP CO., LTD., Beijing (CN); Chongqing BOE Optoelectronics Technology Co., Ltd., Chongqing (CN)

(72) Inventors: Xiongzhou Wei, Beijing (CN); Min Li, Beijing (CN); Qiang Xiong, Beijing (CN); Jiaqi Pang, Beijing (CN); Chao Liu, Beijing (CN); Bin Wan, Beijing (CN); Hongyu Sun, Beijing (CN); Ruilin Bi, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

( * ) Notice: Subject to any disclaimer, the term of this patent is extended or adjusted under 35 U.S.C. 154(b) by 232 days.

(21) Appl. No.: 15/919,340

(22) Filed: Mar. 13, 2018

(65) Prior Publication Data
US 2019/0064648 A1 Feb. 28, 2019

(30) Foreign Application Priority Data
Aug. 28, 2017 (CN) .......................... 2017 1 0751189

(51) Int. Cl.
*G02B 5/20* (2006.01)
*G03C 7/12* (2006.01)
(Continued)

(52) U.S. Cl.
CPC .............. *G03C 7/12* (2013.01); *G02B 5/201* (2013.01); *G02B 5/223* (2013.01); *G03C 8/30* (2013.01);
(Continued)

(58) Field of Classification Search
CPC .......... G03F 7/0007; G02B 5/20; G02B 5/22; G02B 5/223; G02F 1/133514; G02F 1/133516
(Continued)

(56) References Cited

U.S. PATENT DOCUMENTS 5,268,245 A * 12/1993 Chiulli .................. G03F 7/0007
430/145
2002/0085147 A1* 7/2002 Ko .......................... G02B 5/201
349/106
(Continued)

FOREIGN PATENT DOCUMENTS

CN 1945400 A 4/2007
CN 102077140 A 5/2011
(Continued)

OTHER PUBLICATIONS

First Office Action for Chinese Patent Application No. 201710751189.1 dated Oct. 8, 2019.
(Continued)

*Primary Examiner* — John A McPherson
(74) *Attorney, Agent, or Firm* — Calfee, Halter & Griswold LLP

(57) ABSTRACT

Provided is a method for manufacturing a color filter substrate including a base substrate, a black matrix layer and a plurality of color pixel units, and the color pixel unit including sub-pixel units of at least three colors. The method for manufacturing a color filter substrate includes: providing a base substrate; and forming a black matrix layer and the plurality of color pixel units on the base substrate, wherein the forming of the plurality of color pixel units includes: depositing an irreversible temperature-change material on
(Continued)

the base substrate; and heating the irreversible temperature-change material to form sub-pixel units of at least two colors in the color pixel unit.

7 Claims, 7 Drawing Sheets

(51) Int. Cl.
    *G03C 8/30*     (2006.01)
    *G02B 5/22*     (2006.01)
    *G02F 1/1335*     (2006.01)
    *G03F 7/00*     (2006.01)
    *G03F 7/105*     (2006.01)

(52) U.S. Cl.
    CPC ...... *G02F 1/133516* (2013.01); *G03F 7/0007* (2013.01); *G03F 7/105* (2013.01)

(58) Field of Classification Search
    USPC .......................................................... 430/7
    See application file for complete search history.

(56) References Cited

U.S. PATENT DOCUMENTS

2002/0102480 A1*   8/2002   Washizu ................ G02B 5/201
                                                                                                                                                         430/7
2012/0075687 A1*   3/2012   Paolini, Jr. ........ G02F 1/133516
                                                                                                                                                             359/238

FOREIGN PATENT DOCUMENTS

| CN | 106249488 A | 12/2016 |
| CN | 107065290 A | 8/2017 |
| JP | H08248406 A | 9/1996 |

OTHER PUBLICATIONS

Printing Manual, Qian Junhao, pp. 478-480, China Light Industry Press, Apr. 2004.

* cited by examiner

"METHOD FOR MANUFACTURING COLOR FILTER SUBSTRATE"

CROSS REFERENCE TO RELATED APPLICATIONS

This application claims the benefit of China Patent Application No. 201710751189.1 and titled "MANUFACTURING METHOD FOR COLOR FILTER SUBSTRATE" filed with the China Patent Office on Aug. 28, 2017, the entire content of which is hereby incorporated by reference.

TECHNICAL FIELD

The present disclosure relates to the field of display technology, and in particular, to a method for manufacturing a color filter substrate.

BACKGROUND

A Color filter substrate, as an important part of a display device, has to be manufactured through a complicated process. During the manufacture of a color filter substrate, the main process is focused on the manufacture of pixels. For a pixel composed of traditional three RGB primary colors, to form each of the colors, the pixel has to go through a separate mask process including cleaning, coating, exposing, developing and so on. Thus, the pixel composed of three primary colors requires three masking processes. Currently, RGBY four-color pixel display devices have also been widely developed. A RGBY four-color pixel is based on the pixel composed of traditional RGB three primary colors, with an additional yellow sub-pixel to form a RGBY four-color pixel. Through the four-color technology, a wider color gamut can be realized without consuming more power.

However, it also means that an additional mask is required to form the yellow pixel, which increases the complexity of the process. Regardless of the traditional RGB three-primary color pixel structure or the emerging RGBY four-color pixel structure, the use of mask needs to be minimized. A series of processes such as cleaning, coating, exposing and developing can be eliminated for each mask that is eliminated, which can significantly reduce the complexity of the process.

It should be noted that the information disclosed in the above background section is only for the enhancement of understanding of the background of the present disclosure and therefore can include other information that does not form the prior art that is already known to one of ordinary skill in the art.

SUMMARY

The present disclosure provides a for manufacturing a color filter substrate comprising a base substrate, a black matrix layer, and a plurality of color pixel units, and the color pixel unit comprising sub-pixel units of at least three colors, wherein the method for manufacturing the color filter substrate comprises:

providing a base substrate; and forming a black matrix layer and the plurality of color pixel units on the base substrate, wherein the forming of the plurality of color pixel units comprises:

depositing an irreversible temperature-change material on the base substrate; and heating the irreversible temperature-change material to form sub-pixel units of at least two colors in the color pixel unit.

In an exemplary embodiment, the irreversible temperature-change material comprises material selected from a group consisting of sulfate, nitrate, phosphate, sulfide, oxide made of lead, nickel, cobalt, iron, cadmium, strontium, zinc, manganese, molybdenum, and magnesium etc., and azo pigment, phthalocyanine pigment, aryl methane dye.

In an exemplary embodiment, the color pixel unit comprises a red sub-pixel unit, a green sub-pixel unit, a blue sub-pixel unit and a yellow sub-pixel unit, and the method for manufacturing the color filter substrate comprises:

forming at least two yellow sub-pixel units with irreversible temperature-change material in each of the color pixel units, and heating one of the yellow sub-pixel units to obtain a green sub-pixel unit.

In an exemplary embodiment, the irreversible temperature-change material comprises $PbCrO_4$, and a temperature for heating the irreversible temperature-change material $PbCrO_4$ is 800° C. or higher.

In an exemplary embodiment, a temperature for heating the irreversible temperature-change material $PbCrO_4$ is 800° C. or higher.

In an exemplary embodiment, the yellow sub-pixels are of an island structure.

In an exemplary embodiment, the yellow sub-pixels are of a strip structure.

In an exemplary embodiment, the sub-pixel units requiring heating are heated by a fixed point and independently controlled heating method.

In an exemplary embodiment, sub-pixel units in one strip are heated simultaneously.

DETAILED DESCRIPTION

The disclosure is further described below in detail with reference to the accompanying drawings and embodiments. It should be understood that the specific embodiments described herein are only used for explaining the present disclosure rather than limiting the present disclosure. In addition, it should also be noted that, for the convenience of description, only some but not all structures related to the present disclosure are shown in the accompanying drawings.

Figure 1:
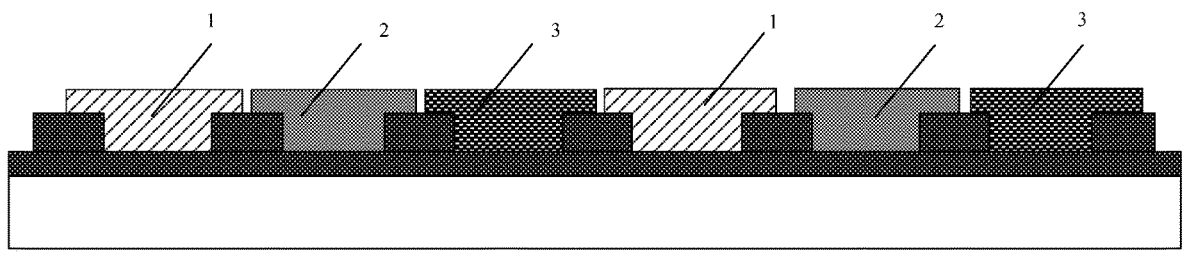
FIG. 1 is a schematic structural diagram of a color filter substrate with RGB three-color pixels.

FIG. 1 is a schematic structural diagram of a color filter substrate with RGB three-color pixels. As shown in FIG. 1, a color filter substrate including RGB tree-color pixels includes a plurality of color pixel units arranged on a black matrix layer. Each color pixel unit includes a red sub-pixel unit 1, a green sub-pixel unit 2 and a blue sub-pixel unit 3. In the related art, in the process of forming these sub-pixel units, the following method is usually adopted.

First, an ITO (indium tin oxide) anode layer and a black matrix layer are formed on a substrate, and the ITO anode layer and the black matrix layer are formed by a conventional process, which is not described herein again. After the ITO anode layer and the black matrix layer are completed, photoresist is coated on the black matrix layer with a mask, to form the red sub-pixel unit 1 by exposure and development, where a mask process is required. After the red sub-pixel unit is formed, through the same process, photoresist is coated on the black matrix layer with a mask, to form the green sub-pixel unit 2 by exposure and development, where a mask process is also required. After that, through the same process, photoresist is coated on the black matrix layer with a mask, to form the blue sub-pixel unit 3 by exposure and development, where a mask process is also required. The formation of the RGB color filter substrate requires three mask processes.

Figure 2:
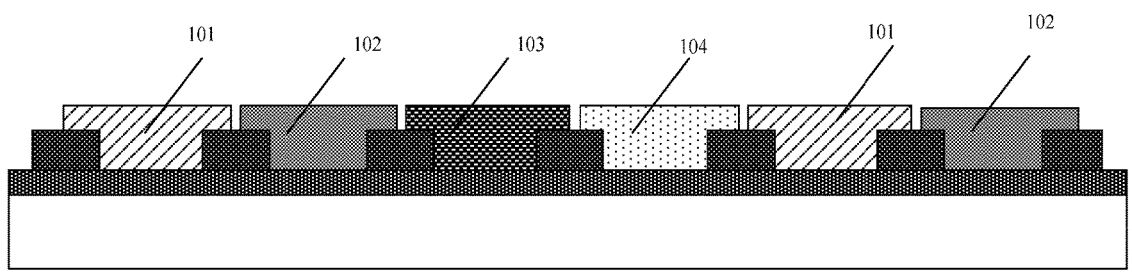
FIG. 2 is a schematic structural diagram of a color filter substrate with RGBY four-color pixels.

FIG. 2 is a schematic structural diagram of a color filter substrate with RGBY four-color pixels. As shown in FIG. 2, a color filter substrate including RGBY four-color pixels includes a plurality of color pixel units arranged on a black matrix layer, and each of the color pixel units includes a red sub-pixel unit 101, a green sub-pixel unit 102, a green sub-pixel unit 103 and a yellow sub-pixel unit 104. In the related art, in the process of forming these sub-pixel units, the following method is usually adopted.

First, an ITO (indium tin oxide) anode layer and a black matrix layer are formed on a substrate, and the ITO anode layer and the black matrix layer are formed by a conventional process, which is not described herein again. After the ITO anode layer and the black matrix layer are completed, photoresist is coated on the black matrix layer with a mask, to form the red sub-pixel unit 101 by exposure and development, where a mask process is required. After the red sub-pixel unit is formed, through the same process, photoresist is coated on the black matrix layer with a mask, to form the green sub-pixel unit 102 by exposure and development, where a mask process is also required. After that, through the same process, photoresist is coated on the black matrix layer with a mask, to form the green sub-pixel unit 103 by exposure and development, where a mask process is also required. Finally, through the same process, photoresist is coated on the black matrix layer with a mask, to form the yellow sub-pixel unit 104 by exposure and development, where a mask process is also required.

Since in the color filter substrate with RGBY four-color pixels, each color pixel unit includes four sub-pixel units of four colors: red, yellow, blue and green, four mask processes are required. The formation order of the sub-pixel units described above is only exemplary, and their formation order may be arbitrarily set.

Figure 3:
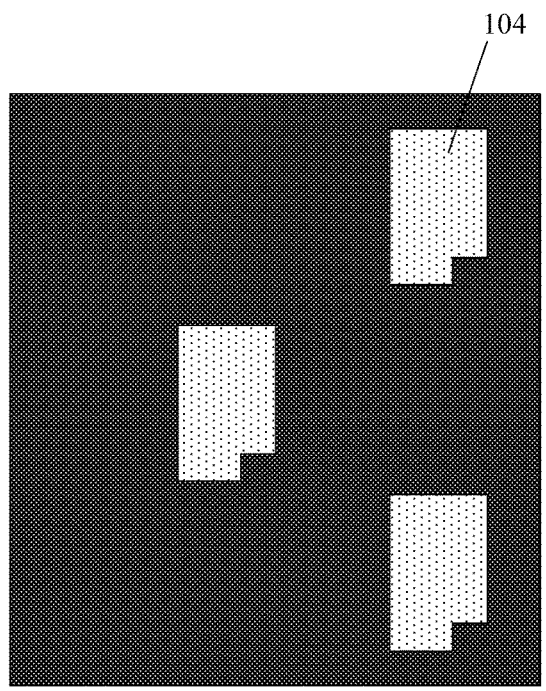
FIG. 3 is a layout diagram of a yellow sub-pixel unit template of an island structure in the related art.
Figure 4:
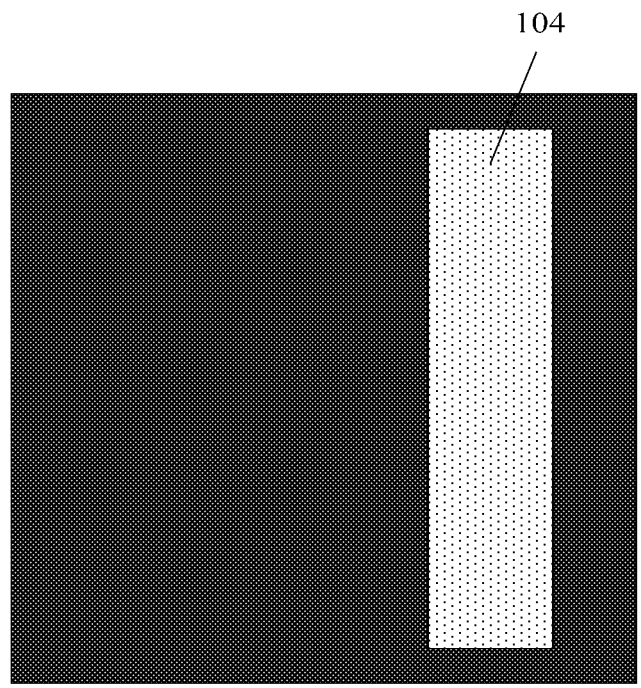
FIG. 4 is a layout diagram of a yellow sub-pixel unit template of a strip structure in the related art.

FIG. 3 is a layout diagram of a yellow sub-pixel unit template of an island structure in the related art. FIG. 4 is a layout diagram of a yellow sub-pixel unit template of a strip structure in the related art. Regardless of whether the yellow sub-pixel unit is an island-like structure or a stripe structure, four mask layers are required for forming the color filter substrate with four-color RGBY pixels, and the complexity of the process is high.

In order to reduce the number of masks used in manufacturing the color filter substrate, the present disclosure provides the following technical solutions.

Figure 5:
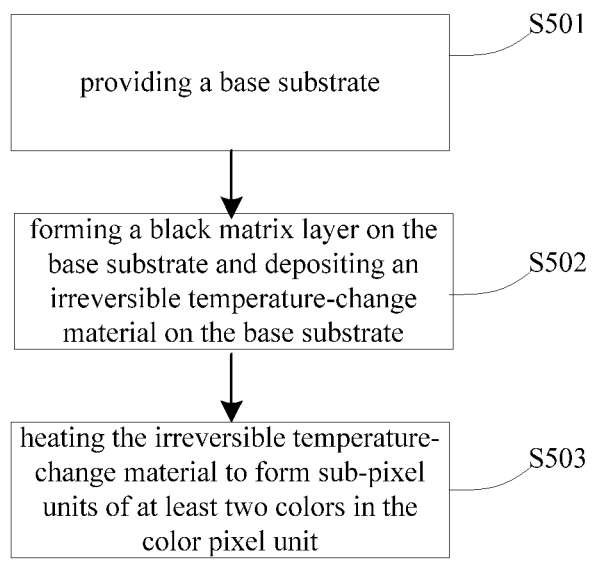
FIG. 5 is a flowchart of a method for manufacturing a color filter substrate according to the present disclosure.

As shown in FIG. 5, at least one embodiment of the present disclosure provides a method for manufacturing a color filter substrate. The color filter substrate includes a base substrate, a black matrix layer and a plurality of color pixel units. The color pixel unit includes sub-pixel units with at least three types of colors. The method for manufacturing a color filter substrate includes the following steps.

In step S501, a base substrate is provided.

A black matrix layer and the plurality of color pixel units are formed on the base substrate. The step of forming the plurality of color pixel units includes the following steps.

In step S502, an irreversible temperature-change material is deposited on the base substrate.

In step S503, the irreversible temperature-change material is heated to form sub-pixel units of at least two colors in the color pixel unit.

The irreversible temperature-change pigment is selected from a group consisting of sulfate, nitrate, phosphate, sulfide, oxide made of lead, nickel, cobalt, iron, cadmium, strontium, zinc, manganese, molybdenum, and magnesium etc., and azo pigment, phthalocyanine pigment, aryl methane dye. These pigments or dyes are discolored by their own thermal decomposition, oxidation or chemical combination. Since they are chemical changes, the process is irreversible, and some of the physical changes are also irreversible.

In the method for manufacturing a color filter substrate provided by the present disclosure, an irreversible temperature-change material is adopted to form sub-pixel units of a part of colors in a color pixel unit, and the part of colors are heated to obtain sub-pixel units of other colors. It can reduce the number of times of using a mask, and can reduce the complexity of the process.

Specifically, the present embodiment provides a method for manufacturing a color filter substrate. The color filter substrate includes a base substrate, a black matrix layer and a plurality of color pixel units. The color pixel unit includes sub-pixel units with four colors, respectively, a red sub-pixel unit, a green sub-pixel unit, a yellow sub-pixel unit and a blue sub-pixel unit.

Figure 6:
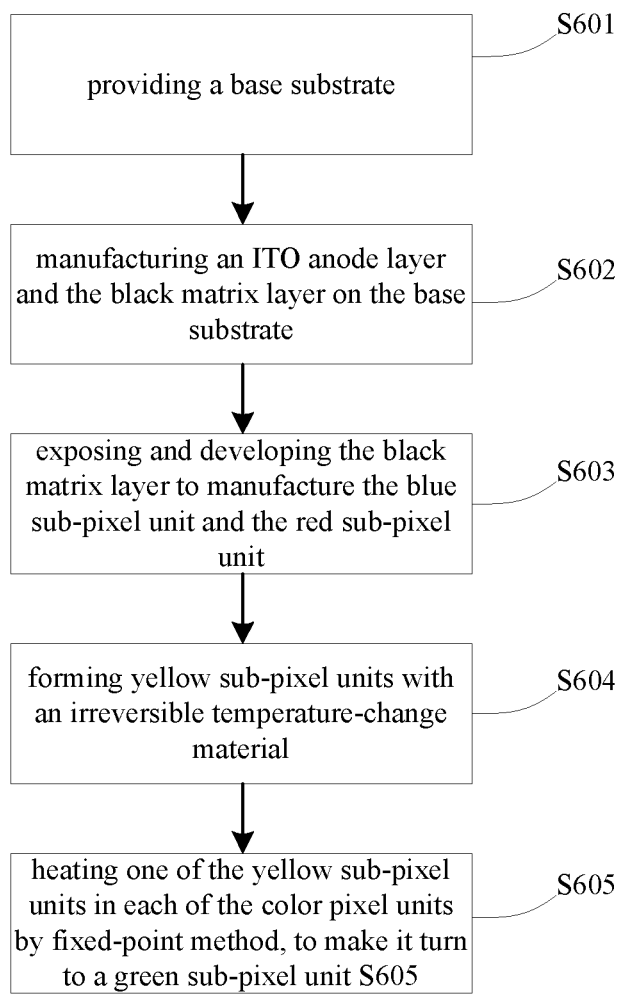
FIG. 6 is a flowchart of a method for manufacturing a color filter substrate according to an embodiment of the present disclosure.

FIG. 6 is a flowchart of a method for manufacturing a color filter substrate according to an embodiment of the present disclosure. The method includes the following steps.

In step S601, a base substrate is first provided. In step S602, an ITO anode layer and the black matrix layer are manufactured on the base substrate according to a conventional process. Next, in step S603, the black matrix layer is exposed and developed through a conventional process to manufacture the blue sub-pixel unit and the red sub-pixel unit.

Figure 7:
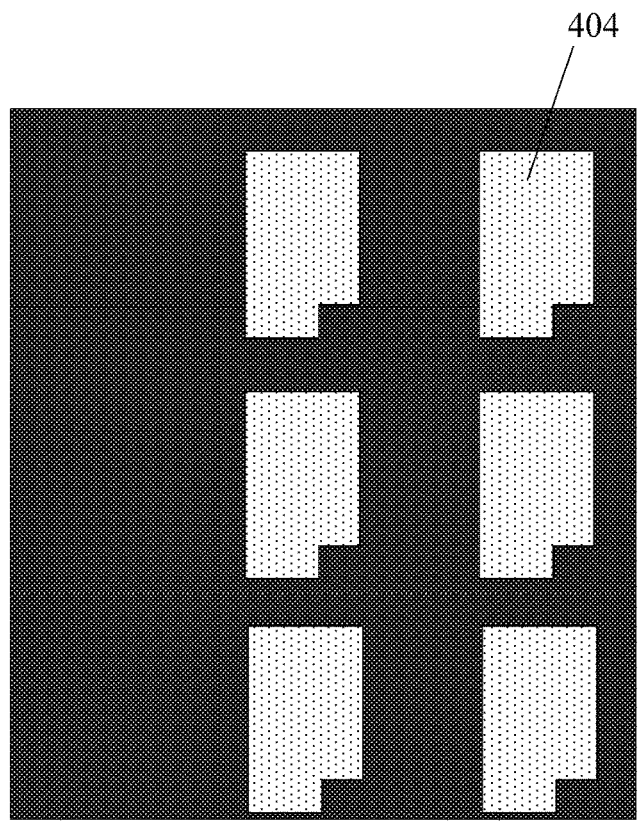
FIG. 7 is a layout diagram of a yellow sub-pixel unit template of an island structure according to an embodiment of the present disclosure.

Next, the yellow sub-pixel unit template is designed. FIG. 7 is a layout diagram of a yellow sub-pixel unit template of an island structure according to an embodiment of the present disclosure. In this embodiment, the blue sub-pixel unit, the red sub-pixel unit and the yellow sub-pixel unit are designed in an island shape, which increases design flexibility.

As shown in FIG. 7, a yellow sub-pixel unit 404 is designed on a black matrix. Then in step S604, yellow sub-pixel units are formed with an irreversible temperature-change material.

Figure 8:
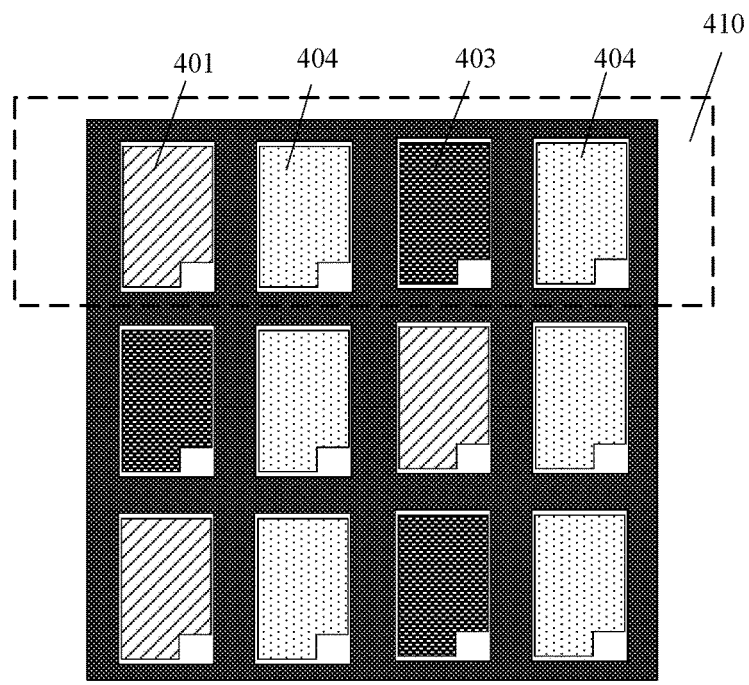
FIG. 8 is a schematic diagram of a pixel arrangement after exposure and development using the layout shown in FIG. 7.

FIG. 8 is a schematic diagram of a pixel arrangement after exposure and development using the layout shown in FIG. 7. As shown in FIG. 8, a yellow sub-pixel unit 404 is formed between the red sub-pixel unit 401 and the blue sub-pixel unit 403. The circled portion as shown by the dotted line in FIG. 8 may be regarded as one color pixel unit 410, and in each color pixel unit 410, the arrangement order of one red sub-pixel unit 401, one blue sub-pixel unit 403, and two yellow sub-pixel units 404 may be arbitrary.

Then, in step S605, one of the yellow sub-pixel units in each of the color pixel units is heated. Since the yellow sub-pixel unit is formed of an irreversibly temperature-change material pigment, it turns into a green sub-pixel unit after being heated.

Irreversible temperature-change pigment refers to that when the pigment is heated to a certain temperature, the color of the pigment changes permanently, and the color generated no longer disappears. For example, the irreversible temperature-change pigment is selected from a group consisting of sulfate, nitrate, phosphate, sulfide, oxide made of lead, nickel, cobalt, iron, cadmium, strontium, zinc, manganese, molybdenum, and magnesium etc., and azo pigment, phthalocyanine pigment, aryl methane dye. These pigments or dyes are discolored by their own thermal decomposition, oxidation or chemical combination. Since they are chemical changes, the process is irreversible, and some of the physical changes are also irreversible.

For example, the irreversible temperature-change pigment $PbCrO_4$ can change from yellow to green at 800° C., and the green color no longer disappears.

In the present embodiment, $PbCrO_4$ is selected to manufacture the yellow sub-pixel unit, and then one of the yellow sub-pixel units in each of the colored pixel units is heated to become a green sub-pixel unit.

Figure 10:
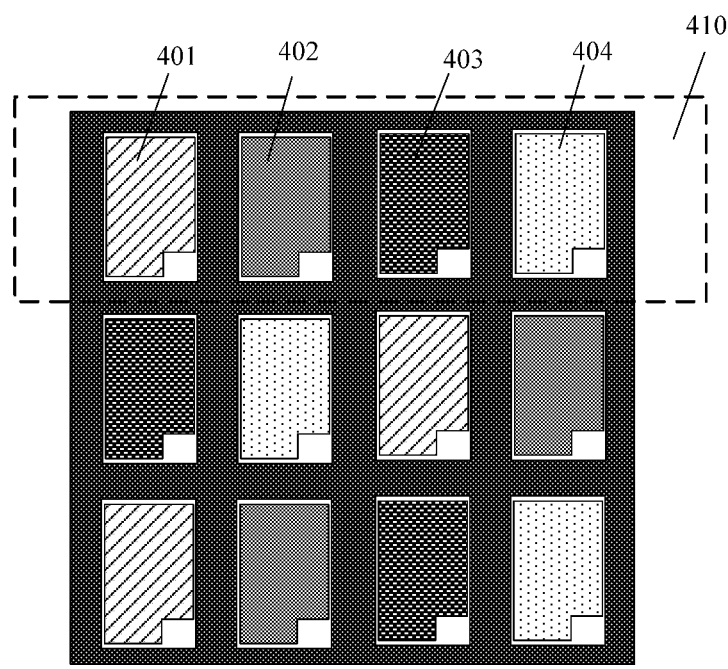
FIG. 10 is a schematic diagram of a pixel arrangement after the pixels in FIG. 8 are heated.

FIG. 10 is a schematic diagram of a pixel arrangement after the pixels in FIG. 8 are heated. As shown in FIG. 10, a red sub-pixel unit 401, a green sub-pixel unit 402, a blue sub-pixel unit 403 and a yellow sub-pixel unit 404 are included in each of the color pixel units 410 to obtain RGBY sub-pixel units of four colors. The arrangement of the sub-pixel units in FIG. 10 is only an example, and the arrangement of the sub-pixel units of the four colors may be arbitrary.

In this embodiment, one mask is used to form two yellow sub-pixel units in one color pixel unit, one of the yellow sub-pixel units is heated to become a green sub-pixel unit, and it is no longer necessary to form a green sub-pixel unit through a mask process. The green sub-pixel unit is formed by heating and changing the yellow sub-pixel unit, without the need of forming the green sub-pixel unit through a mask process as in the related art. It can eliminate one mask process, and realize the manufacture of the RGBY pixel structure through three mask processes, rather than the four mask process required in the related art to manufacture the RGBY pixel structure. It can reduce the complexity of the process, and reduce material and equipment costs.

Figure 9:
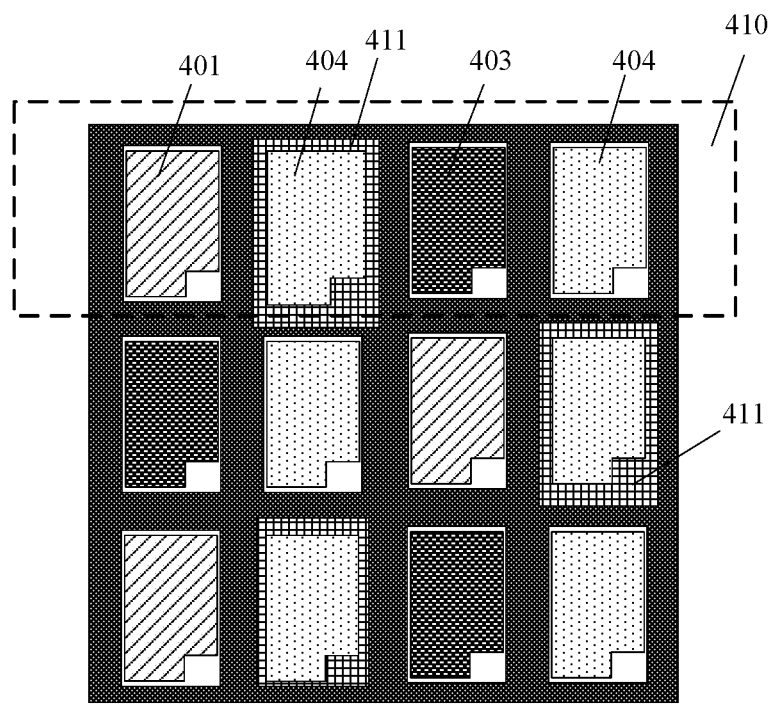
FIG. 9 is a schematic structural diagram of a heating device for heating the yellow sub-pixel unit.

In this embodiment, a fixed point and independently controlled heating method can be used to heat a selected point. FIG. 9 is a schematic structural diagram of a heating device for heating the yellow sub-pixel unit. The above mentioned heating of the yellow sub-pixel unit is performed by the fixed-point heating method. Heating the region of the yellow sub-pixel unit 404 (corresponding to the position of the green sub-pixel unit 402 in FIG. 10) specifically includes heating the selected yellow sub-pixel unit by using a heating layer 411 (as shown in FIG. 9). In an exemplary manner, the selected yellow sub-pixel unit may be covered with the heating layer 411, and the heating layer 411 is energized to generate heat, to heat the selected yellow sub-pixel unit. The portion of the heating layer 411 corresponding to the region other than the region of the yellow sub-pixel unit 404 (corresponding to the position of the green sub-pixel unit 402 in FIG. 9) is a thermal insulation region. The thermal insulation region may be a notch, a hollowed region or a thermal insulation layer, such that the portion not heated by the heating layer 411 remains the original color and the portion heated by the heating layer 411 turns green.

The specific yellow sub-pixel units in each row of pixels may be heated with such heating device to change into green sub-pixel units. This can increase the flexibility of the design, and the sub-pixel units need to be heated can be selected as desired.

Another embodiment of the present disclosure provides a method for manufacturing a color filter substrate, which includes the following steps.

First a base substrate is provided. Then, an ITO electrode layer and a black matrix layer are manufactured on the base substrate according to a conventional process in the related art. Next, conventionally, photoresist is applied on the black matrix layer, and exposed and developed to manufacture the blue sub-pixel unit and red sub-pixel unit.

Figure 11:
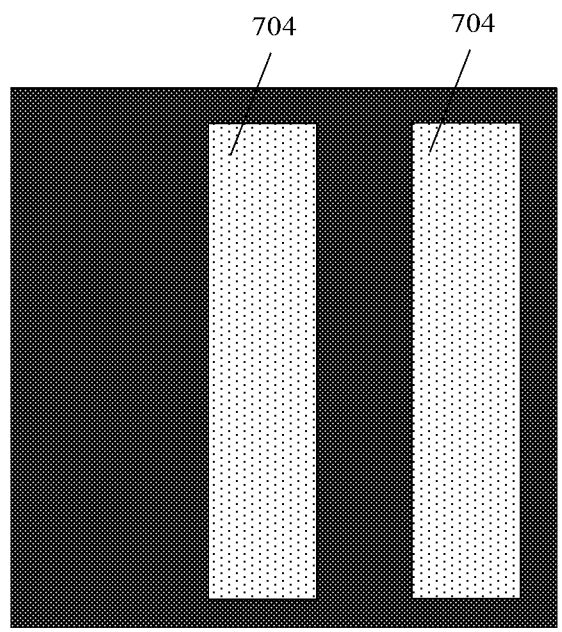
FIG. 11 is a layout diagram of a yellow sub-pixel unit template of a stripe structure according to another embodiment of the present disclosure.

Next, the yellow sub-pixel unit template is designed. FIG. 11 is a layout diagram of a yellow sub-pixel unit template of a stripe structure according to another embodiment of the present disclosure. As shown in FIG. 11, two yellow sub-pixel units 704 spaced apart from each other are designed on the black matrix. In step S804, the yellow sub-pixel units are then formed with an irreversible temperature-change material.

Figure 12:
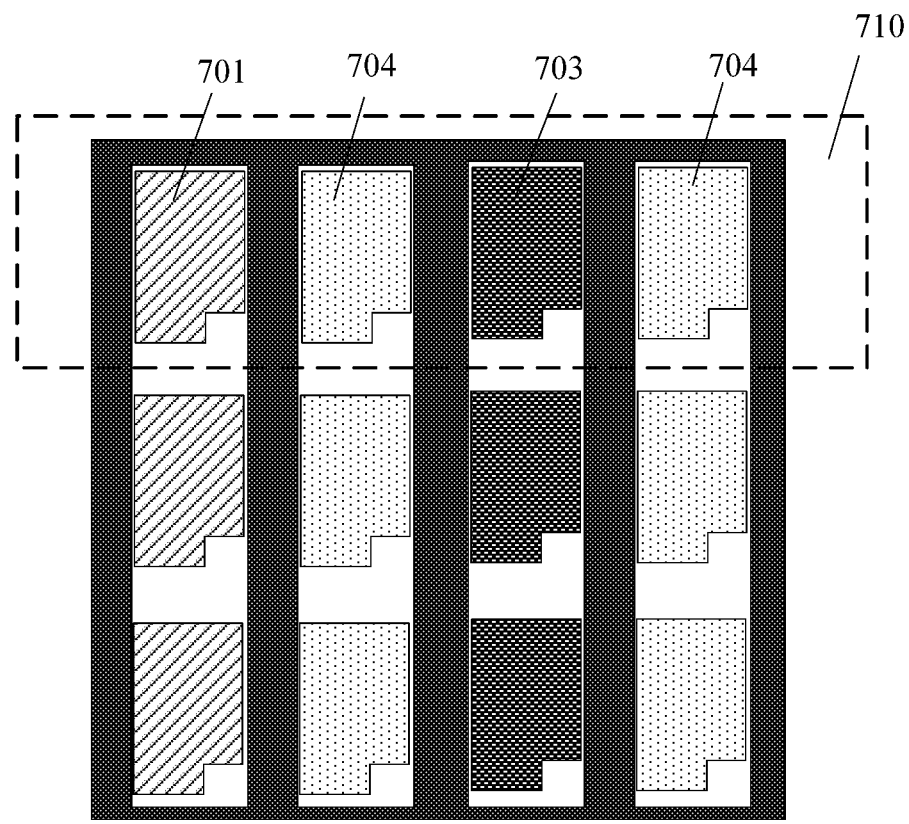
FIG. 12 is a schematic diagram of a pixel arrangement after exposure and development using the layout in FIG. 11.

FIG. 12 is a schematic diagram of a pixel arrangement after exposure and development using the layout in FIG. 11. As shown in FIG. 12, a yellow sub-pixel unit 704 is formed between one red sub-pixel unit 701 and one blue sub-pixel unit 703, and a circled portion by the dotted line in FIG. 11 may be regarded as one color pixel unit 710. Each of the color pixel units 710 includes one red sub-pixel unit 701, one blue sub-pixel unit 703, and two yellow sub-pixel units 704. The two yellow sub-pixel units 704 are not adjacent to each other and spaced apart by the blue sub-pixel unit 703 or the red sub-pixel unit 701. The arrangement order of the sub-pixel units of the colors in FIG. 12 is merely an example. The arrangement of the red sub-pixel unit 701, the blue sub-pixel unit 703 and the two yellow sub-pixel units 704 in each color pixel unit may be arbitrary.

Then, in step S805, one of the yellow sub-pixel units in each of the color pixel units is heated. Since the yellow sub-pixel unit is formed of the irreversible temperature-change pigment, it changes to a green sub-pixel unit after being heated.

As shown in FIG. 12, in this embodiment, the sub-pixel units of the same color are arranged in a stripe arrangement, that is, the arrangement of sub-pixel units in each sub-pixel unit is the same, so that the colors of the sub-pixel units in each column are the same. For example, the arrangement of the yellow sub-pixel units is a stripe structure, and all of the sub-pixel units in a certain column are yellow sub-pixel units.

The heating device used is a strip-shaped heating device. When a yellow sub-pixel unit is heated, the yellow sub-pixel units in the same strip may be heated simultaneously, to be changed to green sub-pixel units. That is, yellow sub-pixel units of a plurality of color pixel units can be heated simultaneously to be changed to green sub-pixel units, which can improve the heating efficiency.

In this embodiment, $PbCrO_4$ is selected for manufacturing the yellow sub-pixel units, and yellow sub-pixel units in each strip are heated to change them into green sub-pixel units.

Figure 13:
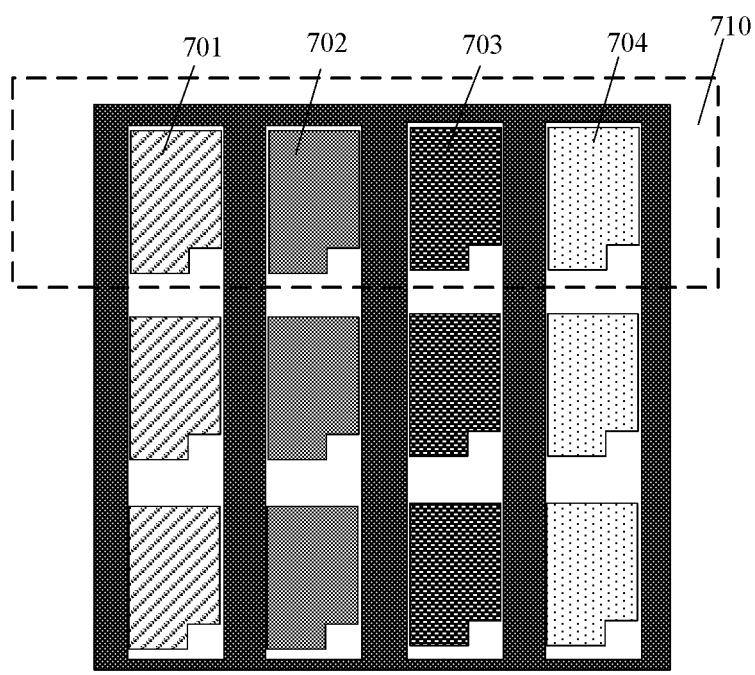
FIG. 13 is a schematic diagram of a pixel arrangement after the pixels in FIG. 12 are heated.

FIG. 13 is a schematic diagram of a pixel arrangement after the pixels in FIG. 12 are heated. As shown in FIG. 12, a red sub-pixel unit 701, a green sub-pixel unit 702, a blue sub-pixel unit 703 and a yellow sub-pixel unit 704 are included in each of the color pixel units 710 to obtain RGBY sub-pixel units of four colors. The arrangement of the sub-pixel units in FIG. 13 is only an example, and the arrangement of the sub-pixel units of the four colors may be arbitrary.

In this embodiment, one mask is used to form two yellow sub-pixel units in one color pixel unit, one of the yellow sub-pixel units is heated to become a green sub-pixel unit, and it is no longer necessary to form a green sub-pixel unit through a mask process. The green sub-pixel unit is formed by heating and changing the yellow sub-pixel unit, without the need of forming the green sub-pixel unit through a mask process as in the related art. It can eliminate one mask process, and realize the manufacture of the RGBY pixel structure through three mask processes, rather than the four mask process required in the related art to manufacture the RGBY pixel structure. It can reduce the complexity of the process, and reduce material and equipment costs.

In addition, in this embodiment, a strip-shaped heating device is used, which can heat one sub-pixel units in one strip and can improve the heating efficiency.

The manufacturing method of the above embodiments is only an example, the color change between the sub-pixel units is not limited to the above change from yellow to green, and other color change may also be performed.

It should be noted that the color filter substrate in this embodiment may include sub-pixels of three colors, for example, red, green and blue sub-pixel units, and the green sub-pixel unit may be formed of an irreversible temperature-changing material. Alternatively, the color filter substrate may also include sub-pixels of four colors or more, such as red, blue, green, yellow sub-pixel units, or red, blue, green, white sub-pixel units, and the like, which are not particularly limited herein.

It should be understood by those skilled in the art that the present disclosure is not limited to the specific embodiments described herein, and various obvious changes, modifications and substitutions can be made by those skilled in the art without departing from the scope of the present disclosure. Therefore, although the present disclosure has been described in detail through the above embodiments, the present disclosure is not limited to the above embodiments, and more other equivalent embodiments may also be included without departing from the concept of the present disclosure, the scope of which is defined by the appended claims.

What is claimed is:

1. A method for manufacturing a color filter substrate comprising a base substrate, a black matrix layer, and a plurality of color pixel units, and the color pixel unit comprising a red sub-pixel unit, a green sub-pixel unit, a blue sub-pixel unit and a yellow sub-pixel unit, wherein the method for manufacturing the color filter substrate comprises:
providing a base substrate; and
forming a black matrix layer and the plurality of color pixel units on the base substrate, wherein the step of forming of the plurality of color pixel units comprises:
depositing an irreversible temperature-change material on the base substrate; and
forming at least two yellow sub-pixel units with irreversible temperature-change material in each of the color pixel units, and heating one of the yellow sub-pixel units to obtain a green sub-pixel unit.

2. The method for manufacturing a color filter substrate according to claim 1, wherein the irreversible temperature-change material comprises material selected from a group consisting of sulfate, nitrate, phosphate, sulfide, oxide made of lead, nickel, cobalt, iron, cadmium, strontium, zinc, manganese, molybdenum, and magnesium, and azo pigment, phthalocyanine pigment, aryl methane dye.

3. The method for manufacturing a color filter substrate according to claim 1, wherein the irreversible temperature-change material comprises $PbCrO_4$, and a temperature for heating the irreversible temperature-change material $PbCrO_4$ is 800° C. or higher.

4. The method for manufacturing a color filter substrate according to claim 1, wherein the yellow sub-pixels are of an island structure.

5. The method for manufacturing a color filter substrate according to claim 1, wherein the yellow sub-pixels are of a strip structure.

6. The method for manufacturing a color filter substrate according to claim 1, wherein the sub-pixel units requiring heating are heated by a fixed point and independently controlled heating method.

7. The method for manufacturing a color filter substrate according to claim 5, wherein sub-pixel units in one strip are heated simultaneously.

* * * * *